ULTRA-HIGH-FREQUENCY TUNER

Filed April 9, 1959 3 Sheets-Sheet 1

*INVENTOR:*
*Heribert Rümmer*
*BY* [signature]
*PATENT AGENT*

Aug. 8, 1961 H. RÜMMER 2,995,657

ULTRA-HIGH-FREQUENCY TUNER

Filed April 9, 1959 3 Sheets-Sheet 2

INVENTOR:

Heribert Rümmer

BY [signature]

PATENT AGENT

INVENTOR
Heribert Rümmer
BY George B. Spencer
ATTORNEY

United States Patent Office 2,995,657

Patented Aug. 8, 1961

2,995,657

ULTRA-HIGH-FREQUENCY TUNER

Heribert Rümmer, Nurnberg, Germany, assignor to Nurnberger Schwachstrom-Bauelemente Fabrik Gesellschaft mit beschrankter Haftung, Nurnberg, Germany Filed Apr. 9, 1959, Ser. No. 805,304
Claims priority, application Germany Apr. 12, 1958
7 Claims. (Cl. 250—40)

Figure 1:
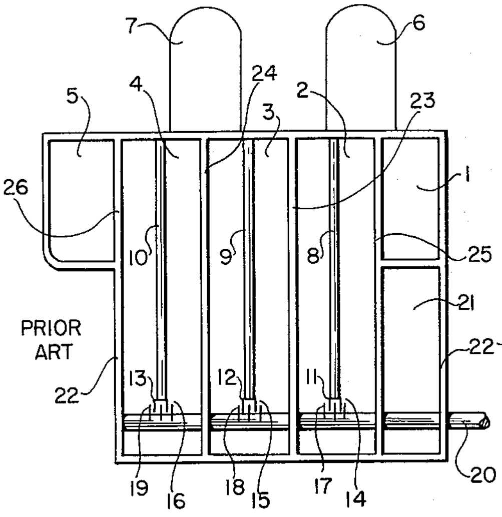

The present invention relates to a variable capacity tuning unit, particularly suitable for television reception in the UHF range, i.e., for frequencies of more than 460 megacycles.

The known UHF tuning units for television receivers comprise an antenna input, frequency selective filters, a mixer, an oscillator, and an intermediate frequency output. The oscillating circuits are generally designed as λ/2 capacity tunable tank circuits. The inner conductors of these circuits terminate at one of their ends in stator plates of variable condensers. The respective rotors of these variable condensers tuning the oscillator and band filter circuits are ganged on a common shaft. The tank circuits of the high-frequency band filters and oscillator are designed in such a manner that they are resonant at the upper limit frequency to be received.

Such known UHF tuning units comprise long-line tank circuits arranged parallel with respect to one another and connected through interposed shield walls which act as outer conductors, whereby the length of the tank circuits corresponds to approximately half the wave length of the uppermost frequency. In this way, the minimum dimensions for the tank circuits are determined.

It has been suggested to effectively shorten the tank circuits by providing the inner conductor with one or several lumped inductance loops rather than purely distributed reactances. As a result of this, the inner conductor is lengthened electrically, although mechanically shortened at the same time.

In order to avoid undesirable mutual coupling of the individual circuits altogether, the tank circuits are physically arranged beside one another in the following order:

Antenna input; first band filter circuit; second band filter circuit; oscillator-mixer; and intermediate frequency circuit.

It is an object of the present invention to provide an improved arrangement of tank circuits within a rectangular housing by staggering the tank circuits in such a manner that space is provided in two diagonally opposite corners of a chassis serving as a housing for the tuning unit, said space being used for housing input and output circuits, respectively, this type of arrangement providing optimum use of the space and at the same time avoiding the necessity of resorting to lumped inductances within the respective tank circuits.

Still further objects and the entire scope of applicability of the present invention will become apparent from the detailed description given hereinafter; it should be understood, however, that the detailed description and specific examples, while indicating preferred embodiments of the invention, are given by way of illustration only, since various changes and modifications within the spirit and scope of the invention will become apparent to those skilled in the art from this detailed description.

In the drawings:

FIGURE 1 is a schematic diagram of a conventional tank circuit assembly for an UHF tuner.

FIGURES 2 to 6 inclusive are schematic diagrams of five diverse tuner tank circuit assemblies improved according to the present invention.

In the various figures analogous portions of the various assemblies are provided with similar reference characters.

In the prior-art tuner assembly shown in FIGURE 1, there are provided an antenna input 1; a first band filter circuit 2; a second band filter circuit 3; an oscillator circuit 4; and an intermediate frequency circuit 5 having an intermediate frequency output. Reference character 6 denotes an input amplifier tube, while 7 is a self-oscillating mixer tube. Reference numerals 8, 9, and 10 denote inner conductors of the tank circuits 2, 3, and 4, respectively, said inner conductors terminating at one of their ends in stators 11, 12, and 13 of variable condensers 14, 15, and 16, respectively, their rotors 17, 18, and 19, respectively, being mounted on a common shaft 20.

A chamber 21 housing a reduction gear may be provided, said gear serving to drive the shaft 20 from another shaft (not shown). However, the chamber 21 is not necessary in all cases and may be omitted from the construction.

The tuning unit comprising the λ/2 tank circuits 2, 3, and 4 with auxiliary chambers 1 and 5 is enclosed by walls 22 forming the housing of the unit, and wherein, as shown in FIGURE 1, the housing walls 22 partially coincide with outer tank circuit walls 25 and 26 of the outer tank circuits 2 and 4. Tank circuit walls 23 and 24 form major partitions between the tank circuits 2 and 3 or 3 and 4, respectively, and serve as outer conductors for these tank circuits.

The present invention is based on the general construction of the UHF tuning unit shown in FIG. 1, and it is the object of the invention to reduce the dimensions of this UHF unit by an improved design and arrangement of the tank circuits, whereby the Q of the tank circuit is considerably increased. This result is obtained in accordance with the present invention by providing within a suitably rectangular housing having a number of parallel walls in a row partitioned off λ/2 tank circuits for the band filters and the oscillator arranged in such a manner that these walls together with the outside walls of the unit form in the cross-sectional plane of the adjacent tank circuits two chambers lying diagonally opposite with respect to one another, these chambers being generally smaller than the λ/2 tank circuit chambers and deviating from the latter in their shape. These smaller chambers disposed in diagonally opposite corners of the unit are used to house input circuits and intermediate frequency circuits and are isolated by minor partitions 25 and 26.

Figure 2:
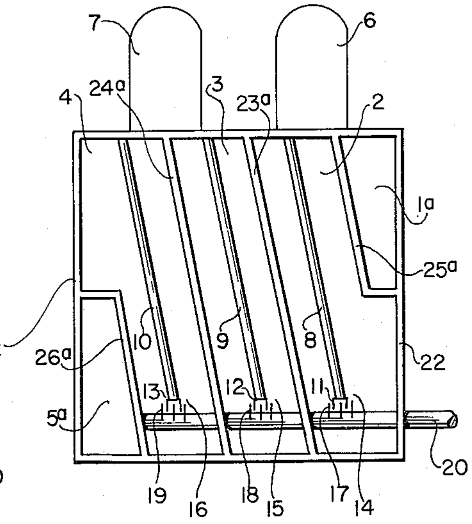

In the embodiment of the invention shown in FIGURE 2, the adjacent λ/2 tank circuits are straight and arranged parallel with respect to one another and are provided in the housing of the tuning unit in an inclined position in such a manner that tank circuit walls **25*a* and 26*a* and partitions 23*a* and 24*a* are oriented obliquely to the outside walls 22 of the tuning unit, said walls 22 being parallel with respect to one another. However the walls forming the outer tank circuits 25*a* and 26*a* only partially correspond with the housing walls 22. As a result of this, sufficiently large tank circuits are obtained within the rectangular chassis surrounding the tank circuits, and two chambers 1*a* and 5*a*** can also be included in the cross section of the housing diagonally opposite one another.

According to a further development of the invention illustrated in FIGURES 3 to 6, parallel walls are arranged on opposite sides of the λ/2 tank circuits and are offset so that two spaced parallel tank circuit portions are joined by inclined portions in each tank circuit.

Figure 3:
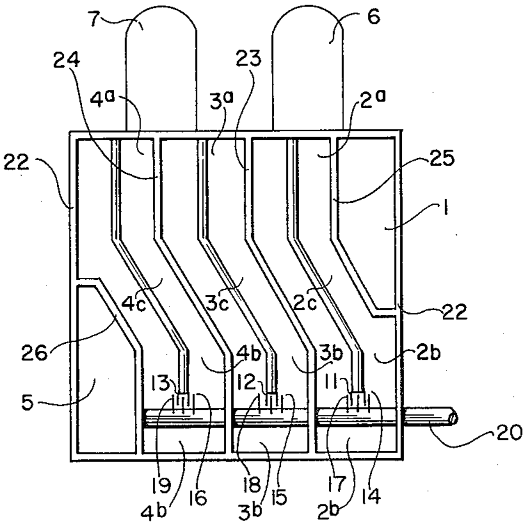

As shown in FIGURE 3, two parallel walls of tank circuits of the band filters and oscillator are offset twice in such a manner that respectively staggered portions **2*a* and 2*b*, 3*a* and 3*b*, 4*a* and 4*b*, are respectively joined by intervening inclined portions 2*c*, 3*c*, and 4*c***.

Figure 4:
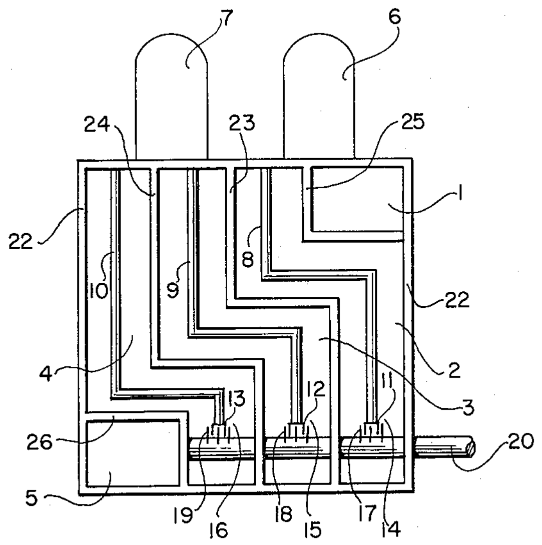

According to FIGURE 4, a further embodiment of the invention is provided in which the tank circuit walls are each offset twice at right angles in opposite directions, so that for each tank circuit there are two parallel portions staggered with respect to one another and one portion connecting said parallel portions and perpendicular thereto.

Figure 5:
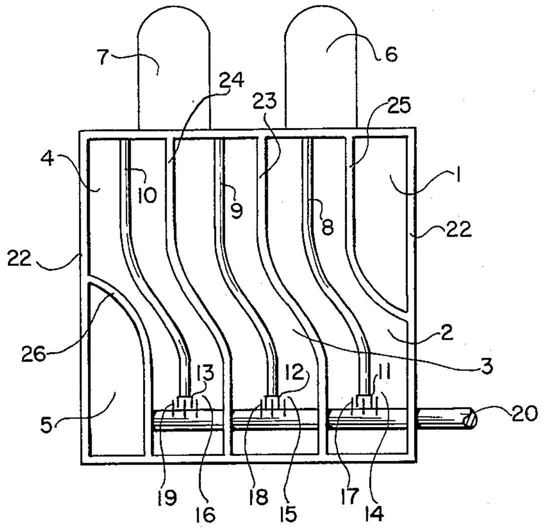

It is also possible, according to a still further embodiment of this invention shown in FIGURE 5, to provide the offset parts with a relatively large curvature radius, so that angular corners and sharp bends within the tank circuits are reduced.

The inner conductors of the $\lambda/2$ tank circuits, respectively, correspond with the shape of the tank circuit walls, i.e., of the outer conductors of the tank circuits.

The chambers 1 and 5 which, due to the design of the tank circuits and their arrangement within the tuning unit, are arranged diagonally opposite one another within an approximately rectangular cross section of the tuning unit, are generally smaller than the $\lambda/2$ tank circuits and are suitably designed as input chambers and intermediate frequency circuit chambers.

Figure 6:
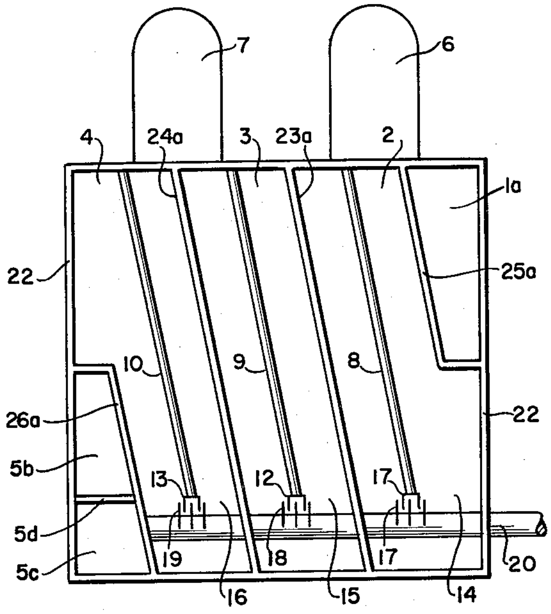

It is also possible, according to the invention and as shown in FIGURE 6, to design the intermediate frequency circuit as an intermediate frequency tuned filter, whereby, if need be, the intermediate frequency circuit chamber can be divided into two smaller chambers *5b* and *5c* by means of a partition *5d*.

According to the invention, the whole tuning unit can be made smaller and more attractive than known units of this kind. The chamber in FIGURES 2 to 6, unlike that of FIGURE 1, does not extend beyond the rectangular limits of the unit. The inner conductor in FIGURES 2 to 6 is longer than that in FIGURE 1. Assuming that the inner conductor of FIGURE 1 can be made as short as the inner conductors in FIGURES 2 to 6 by providing one or several loops therein, the design according to the invention results in superior Q of the tank circuits, whereby amplification, noise level and selectivity are improved.

What is claimed is:

1. In a tank assembly in the chassis of an UHF television tuner having rectangular outer walls, said tuner including an input stage tank circuit, a mixer stage tank circuit and an oscillator tank circuit, each of which includes a chamber and an inner conductor therewithin forming a resonant circuit $\lambda/2$ in length, the improvement comprising major partitions in the chassis and dividing the latter into parallel chambers, the major partitions at one end all being laterally offset from the other ends of the major partitions to leave in two diagonally opposite corners of the chassis enlarged spaces between the side walls of the chassis and the adjacent major partitions; and two minor partitions near the respective corners and dividing said enlarged spaces to form in one corner an input circuit chamber and in the other corner an intermediate-frequency circuit chamber.

2. In an assembly as set forth in claim 1, said major partitions and said inner conductors all being straight, and being disposed in mutually parallel relationship diagonally across the chassis, and said minor partitions extending between adjacent outer walls of the chassis.

3. In an assembly as set forth in claim 1, said major partitions and said inner conductors being bent in two places so as to offset the opposite ends of the tank circuits, the portions of the major partitions and of the inner conductors lying on opposite sides of the two bent places being mutually parallel and joined in each case by an intervening portion.

4. In an assembly as set forth in claim 3, said intervening portions each being perpendicular to the adjoining portions.

5. In an assembly as set forth in claim 3, said intervening portion joining at each end an adjoining portion at an obtuse angle.

6. In an assembly as set forth in claim 1, said major partitions and said inner conductors each being gradually bent in opposite directions in two spaced places so as to offset the opposite ends of the tank circuits which are mutually parallel within said chassis, and said minor partitions being curved and extending between adjacent outer walls of the chassis.

7. In an assembly as set forth in claim 1, said intermediate-frequency circuit including several tuned circuits and the intermediate-frequency chamber being subdivided to individually house the several tuned circuits.

References Cited in the file of this patent

UNITED STATES PATENTS

| | | |
|---|---|---|
| 1,747,938 | Hull | Feb. 18, 1930 |
| 2,014,521 | Casper | Sept. 17, 1935 |
| 2,169,305 | Tunick | Aug. 15, 1939 |
| 2,819,391 | Reiches | Jan. 7, 1958 |
| 2,821,623 | Thias | Jan. 28, 1958 |

OTHER REFERENCES

Institute of Radio Engineering Transactions on Microwave Theory and Techniques, volume MTT–3, March 1955, number 2, pages 165, 168.